United States Patent
Tseng et al.

(10) Patent No.: US 12,487,531 B2
(45) Date of Patent: Dec. 2, 2025

(54) EXTREME ULTRAVIOLET (EUV) RADIATION SOURCE APPARATUS, EUV LITHOGRAPHY SYSTEM, AND METHOD FOR GENERATING EXTREME ULTRAVIOLET RADIATION

(71) Applicant: TAIWAN SEMICONDUCTOR MANUFACTURING COMPANY LTD., Hsinchu (TW)

(72) Inventors: Hsin-Fu Tseng, Hsinchu County (TW); Chih-Chiang Tu, Taoyuan (TW); Chih-Wei Wen, Tainan (TW); Chien-Hsing Lu, Tainan (TW); Tzu Jeng Hsu, Taoyuan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 397 days.

(21) Appl. No.: 18/312,579

(22) Filed: May 4, 2023

(65) Prior Publication Data
US 2024/0369936 A1 Nov. 7, 2024

(51) Int. Cl.
G03F 7/00 (2006.01)
(52) U.S. Cl.
CPC .................. *G03F 7/70033* (2013.01)
(58) Field of Classification Search
USPC ..................................................... 250/504 R
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2007/0018119 A1* | 1/2007 | Yabuta .................. | B82Y 10/00 250/493.1 |
| 2020/0060014 A1* | 2/2020 | Vinokhodov ........ | H05G 2/0094 |
| 2023/0418171 A1* | 12/2023 | Yabuta ................ | G03F 7/70166 |

\* cited by examiner

*Primary Examiner* — Kiet T Nguyen
(74) *Attorney, Agent, or Firm* — WPAT LAW; Anthony King (57) ABSTRACT

An EUV radiation source apparatus includes an EUV source vessel including a chamber; a crucible disposed in the chamber; a tin layer disposed on the crucible; a catcher disposed in the chamber and configured to collect fuel debris generated from a collision of the tin layer and a laser beam; a heat dissipation structure disposed over the catcher; and a venting system coupled to the EUV source vessel and communicable with the chamber. A method for generating EUV radiation includes: collecting fuel debris on a catcher disposed in a chamber of an EUV source vessel; dissipating heat from the catcher to the chamber; and venting a gas out of the EUV source vessel to cool the chamber to a decreased temperature through an opening disposed on the EUV source vessel.

20 Claims, 9 Drawing Sheets

EXTREME ULTRAVIOLET (EUV) RADIATION SOURCE APPARATUS, EUV LITHOGRAPHY SYSTEM, AND METHOD FOR GENERATING EXTREME ULTRAVIOLET RADIATION

BACKGROUND

Extreme ultraviolet (EUV) radiation, e.g., electromagnetic radiation having wavelengths of around 50 nm or less, and including light having a wavelength of about 13.5 nm, can be used in photolithography processes to produce extremely small features in substrates such as silicon wafers. Methods for generating EUV radiation include converting a fuel material from a liquid state into a plasma state. In the plasma state, the fuel material emits photons having the desired wavelength, which is provided as EUV radiation.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 6b is an enlarged schematic view of the venting component shown in FIG. 6a.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the present disclosure, an extreme ultraviolet (EUV) radiation source apparatus and a method for generating EUV radiation are provided. In some embodiments, the EUV radiation source apparatus includes an EUV source vessel including a chamber, a crucible disposed in the chamber, a tin layer disposed on the crucible, a catcher disposed in the chamber, a heat dissipation structure disposed over the catcher, and a venting system coupled to the EUV source vessel and communicable with the chamber. As a result, heat generated from a collision of the tin layer and a laser beam may be dissipated from the chamber of the EUV source vessel, and a recycle efficiency of fuel debris and stabilization and service life of the EUV radiation source are improved.

A method for generating EUV radiation provided according to some embodiments of the present disclosure includes: collecting fuel debris on a catcher disposed in a chamber of an EUV source vessel, dissipating heat from the catcher to the chamber; and venting a first gas out of the EUV source vessel to cool the chamber to a decreased temperature through an opening disposed on the EUV source vessel. Other features and processes may also be included.

The method for generating EUV radiation generally includes providing a laser beam directed toward a tin layer. As the laser beam strikes the tin layer, the tin layer is heated to a critical temperature and fuel debris is formed. The collision of the tin layer and the laser beam causes atoms of the tin layer to shed their electrons and form a plasma of ionized fuel. The plasma of ionized fuel emits photons having a wavelength less than 50 nm, which is provided as EUV radiation.

In some embodiments, the fuel debris from the collision may bounce around the chamber and a crucible. Cleaning of the chamber is a time-consuming process that requires stopping generation of the EUV radiation. In some embodiments, the catcher disposed in the chamber is configured to collect the fuel debris and direct the EUV radiation toward an exit of the chamber and onto a semiconductor workpiece.

Figure 1:
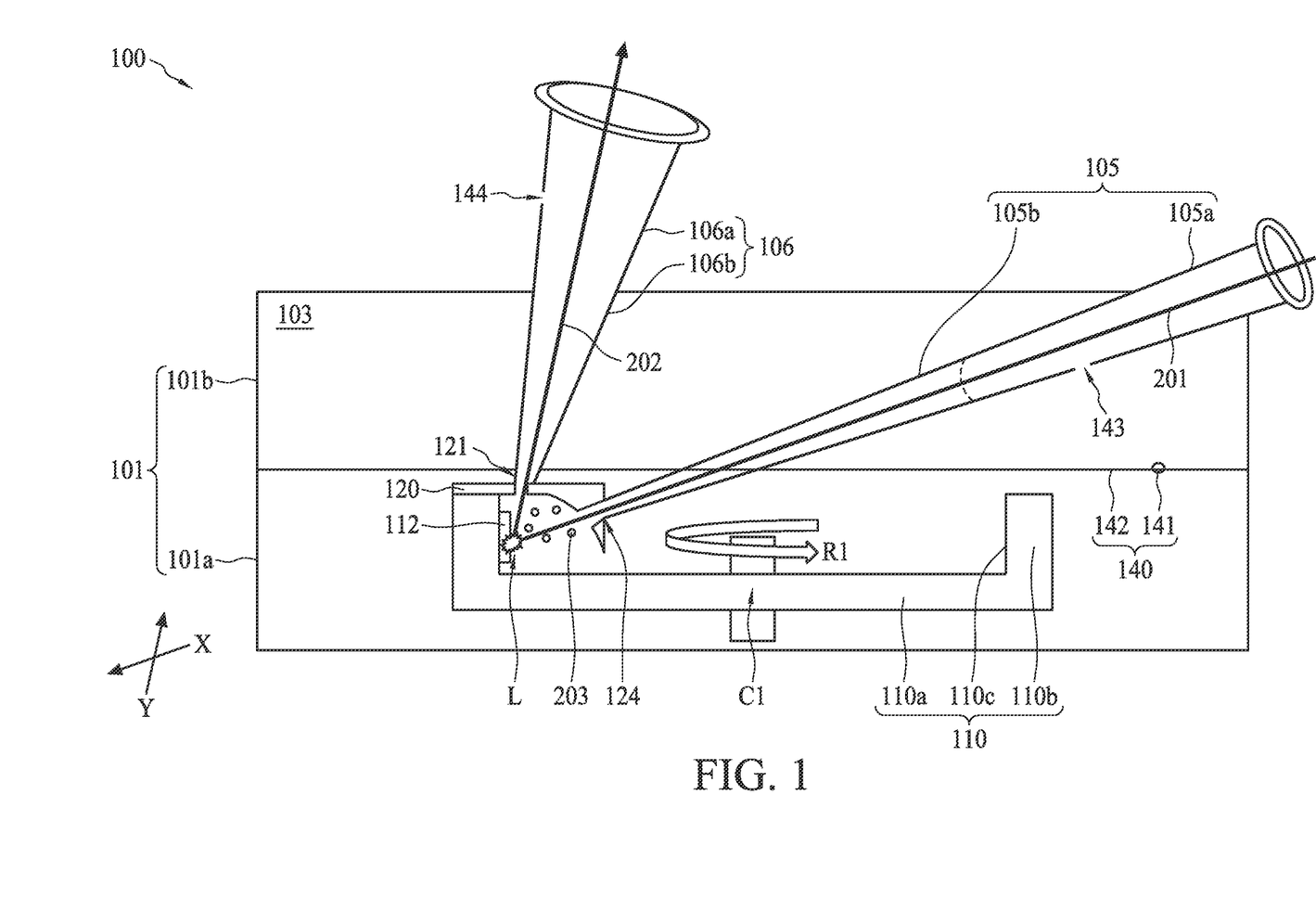
FIG. 1 is a schematic view of an EUV radiation source apparatus in accordance with some embodiments of the present disclosure.

FIG. 1 is a schematic view of an EUV radiation source apparatus 100 including an EUV source vessel 101 in accordance with some embodiments of the present disclosure. In some embodiments, referring to FIG. 1, the EUV source vessel 101 includes a chamber 103. The EUV radiation source apparatus 100 further includes a crucible 110 disposed in the chamber 103, a tin layer 112 disposed on the crucible 110, and a catcher 120 disposed in the chamber 103 and configured to collect fuel debris 203 generated from a collision of the tin layer 112 and a laser beam 201. The EUV source vessel 101 further includes a heat dissipation structure 130 (shown in FIGS. 3 and 4) disposed over the catcher 120, and a venting system 140 coupled to the EUV source vessel 101 and communicable with the chamber 103.

In some embodiments, the chamber 103 is configured to receive the crucible 110, the tin layer 112, the catcher 120, and the fuel debris 203. The chamber 103 is configured to direct a generated EUV radiation 202 out of the chamber 103 to a predetermined position, but the disclosure is not limited thereto. In some embodiments, the chamber 103 is held in a vacuum state (e.g., at a pressure of less than $10^{-2}$ mbar). In some embodiments, the chamber 103 is a high-vacuum chamber. A size, a material and a configuration of the chamber 103 are not particularly limited, and may be adjusted according to actual needs. In some embodiments, the configuration of the chamber 103 may be adjusted in order to increase efficiency of generating the EUV radiation 202. In some embodiments, the chamber 103 has a round or oval shape from a top view.

In some embodiments, the crucible 110 disposed in the chamber 103 is rotatable. In some embodiments, the crucible 110 is rotatable about a first center C1 and in a first direction R1. In some embodiments, the crucible 110 is rotatable in a clockwise or a counter-clockwise direction. In some embodiments, the crucible 110 is rotated at a predetermined interval. In some embodiments, the tin layer 112 is disposed on the crucible 110 and may be rotatable about the first center C1 and in the first direction R1 along with the crucible 110.

In some embodiments, the crucible 110 includes a bottom wall 110a and a sidewall 110b disposed on the bottom wall 110a. In some embodiments, the tin layer 112 is disposed on an inner surface 110c of the sidewall 110b of the crucible 110. In some embodiments, the crucible 110 includes a crystal structure.

In some embodiments, the tin layer 112 is attached to the crucible 110. In some embodiments, the tin layer 112 is disposed on a portion of the inner surface 110c of the sidewall 110b of the crucible 110. In some embodiments, the tin layer 112 is ring-shaped and surrounds the first center C1. In some embodiments, the tin layer 112 is separated from the bottom wall 110a of the crucible 110. In some embodiments, a thickness T1 of the tin layer 112 is uniform. In some embodiments, a variation of the thickness T1 of the tin layer 112 is less than 30 nm. In some embodiments, the variation of the thickness T1 of the tin layer 112 is less than 15 nm.

Figure 2:
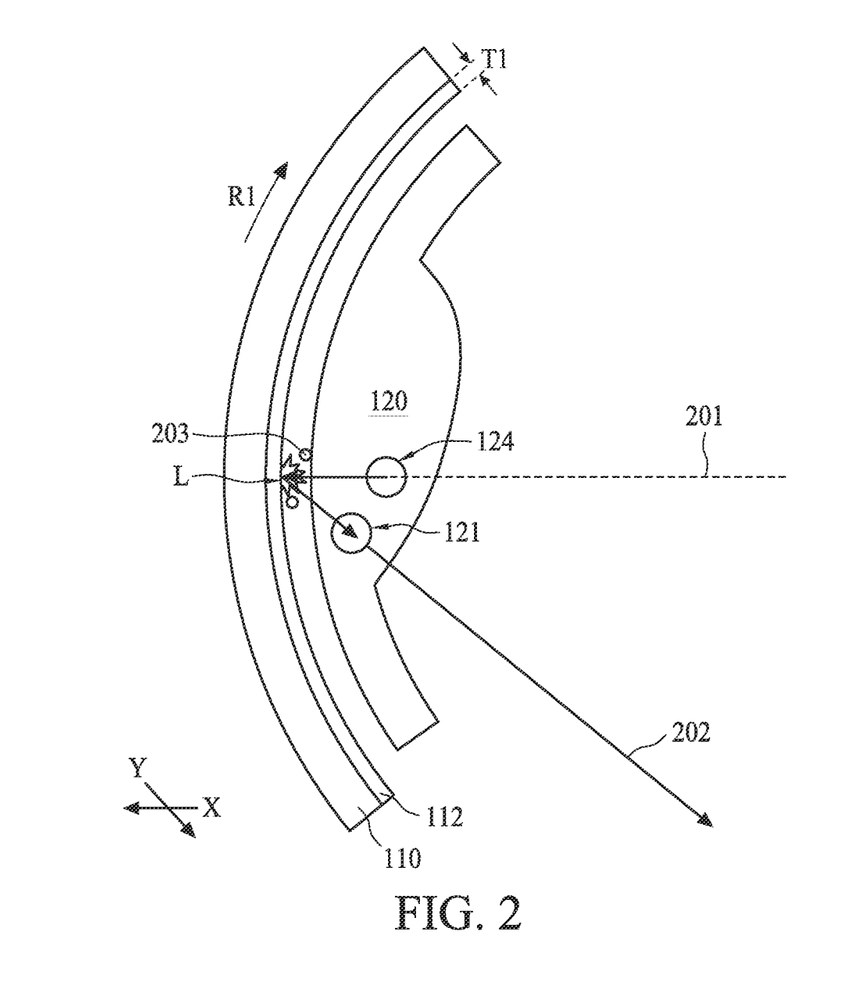
FIG. 2 is a schematic view of a portion of an EUV radiation source apparatus according to aspects of the present disclosure in some embodiments.

FIG. 2 is a schematic view of a portion of the EUV radiation source apparatus 100 in accordance with some embodiments of the present disclosure. In some embodiments, referring to FIG. 1 and FIG. 2, the catcher 120 is configured to collect fuel debris 203 generated from the collision of the tin layer 112 and the laser beam 201. In some embodiments, a functionality of the EUV radiation source apparatus 100 may be improved since the catcher 120 catches the fuel debris 203.

In some embodiments, the catcher 120 is disposed over the tin layer 112 and the crucible 110. In some embodiments, the tin layer 112 is disposed between the catcher 120 and the crucible 110. In some embodiments, a location L, where the fuel debris 203 is generated, is disposed between the tin layer 112 and the catcher 120. In some embodiments, the catcher 120 catches the fuel debris 203 generated at the location L. In some embodiments, the catcher 120 is spaced apart from the tin layer 112. In some embodiments, the fuel debris 203 collected by the catcher 120 may flow to the crucible 110. In some embodiments, the catcher 120 is disposed over at least a portion of the tin layer 112 from a top view. A shape of the catcher 120 may be adjusted according to actual factors, such as various configurations of the tin layer 112 and the crucible 110.

In some embodiments, the catcher 120 includes a first aperture 121 configured to be an exit of the EUV radiation 202. In some embodiments, the catcher 120 includes a second aperture 124 configured to be an entrance of the laser beam 201 to allow the laser beam 201 to be directed toward the tin layer 112. In some embodiments, the second aperture 124 is disposed adjacent to the first aperture 121. In such embodiments, the first aperture 121 and the second aperture 124 are separated from each other. In some embodiments, the catcher 120 includes only the first aperture 121. In some embodiments, the catcher 120 includes the first aperture 121 and the second aperture 124.

Figure 3:
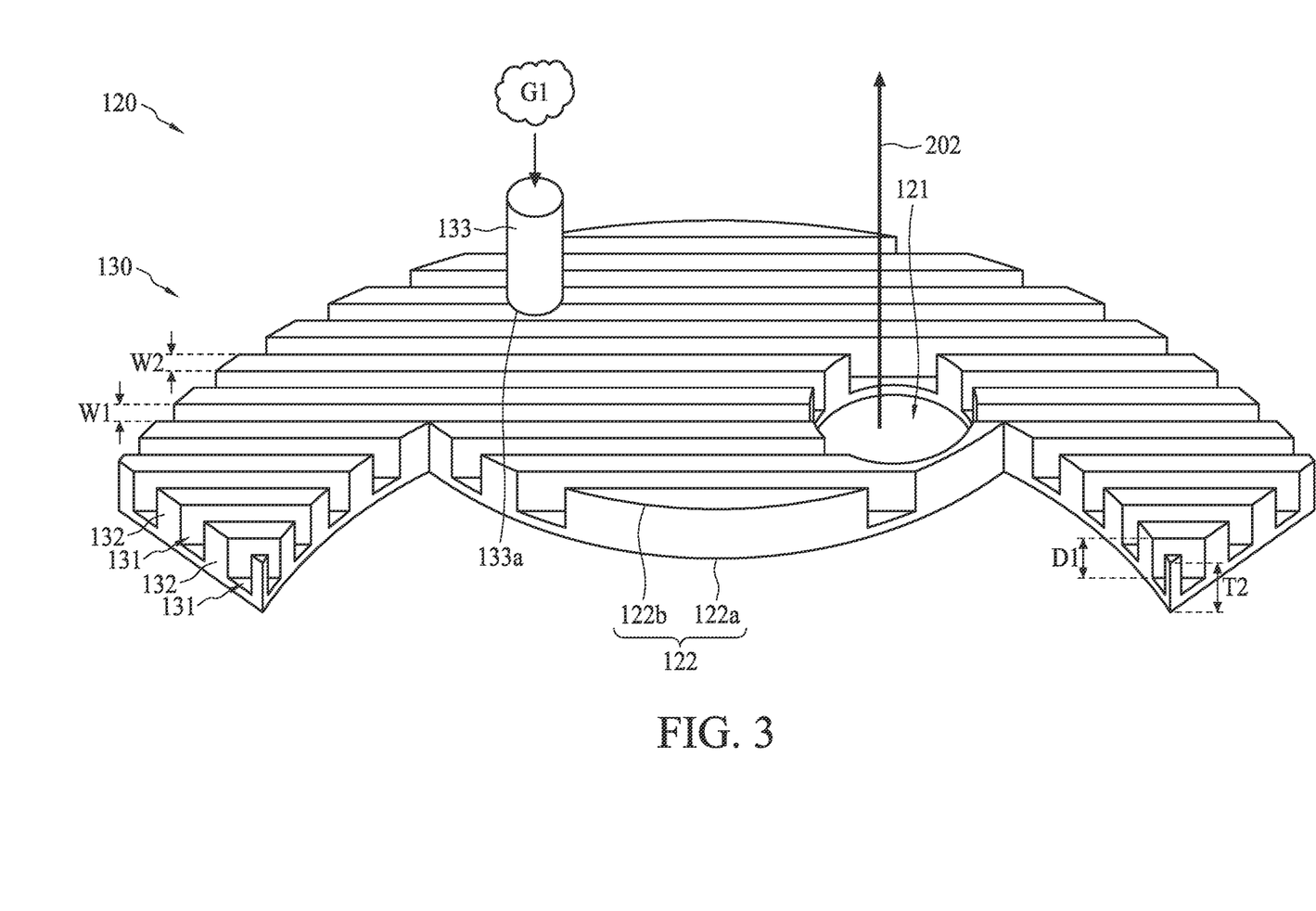
FIGS. 3 and 4 are schematic views of a catcher and a heat dissipation structure of an EUV radiation source apparatus in accordance with some embodiments of the present disclosure.
Figure 4:
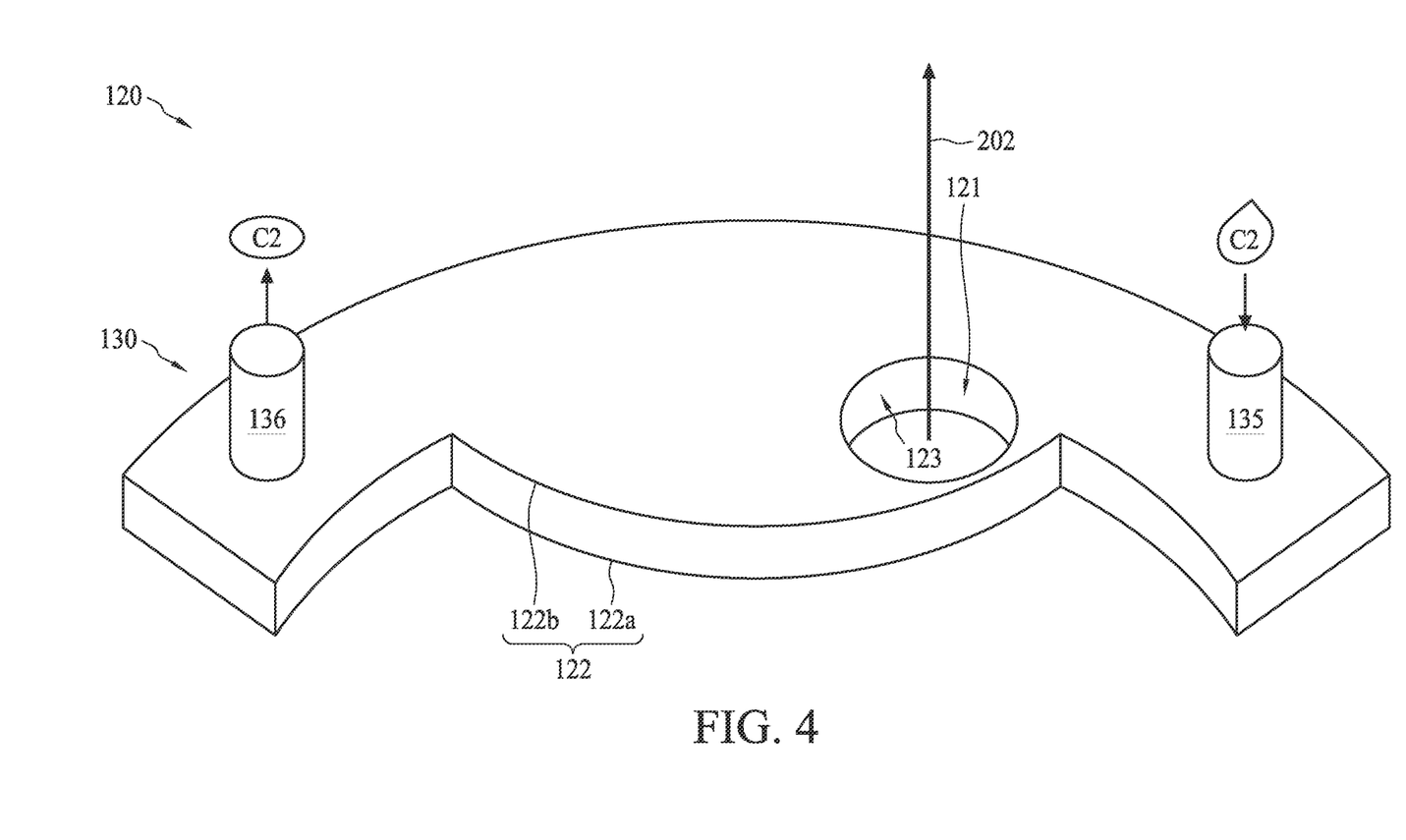

FIGS. 3 and 4 are schematic views of a catcher 120 and a heat dissipation structure 130 of an EUV radiation source apparatus 100 in accordance with some embodiments of the present disclosure. In some embodiments, the heat dissipation structure 130 is disposed over the catcher 120. In some embodiments, referring to FIG. 3, the heat dissipation structure 130 is disposed on an outer surface 122 of the catcher 120. In some embodiments, the heat dissipation structure 130 and the catcher 120 are integral. In some embodiments, the heat dissipation structure 130 includes a groove portion 131 and a bump portion 132 arranged on the outer surface 122 of the catcher 120. In some embodiments, the outer surface 122 of the catcher 120 includes a first side 122a facing the tin layer 112 and a second side 122b opposite to the first side 122a. In some embodiments, the heat dissipation structure 130 is disposed on the second side 122b of the outer surface 122 of the catcher 120. In some embodiments, the heat dissipation structure 130 is disposed on the first side 122a and the second side 122b of the outer surface 122 of the catcher 120.

In some embodiments, the heat dissipation structure 130 is configured to decrease a temperature of the catcher 120. The heat dissipation structure 130 may dissipate heat from the catcher 120 into a chamber 103. In some embodiments, the heat dissipation structure 130 includes the groove portion 131 and the bump portion 132 arranged on the outer surface 122 of the catcher 120 to enhance a surface area of the catcher 120. In some embodiments, the groove portion 131 is disposed adjacent to the bump portion 132. In some embodiments, the groove portion 131 has a first width W1 and the bump portion 132 has a second width W2, and a width ratio (W1/W2) of the groove portion 131 and the bump portion 132 ranges between 1:1 and 10:1. In some embodiments, the groove portion 131 has a first depth D1, wherein the first depth D1 ranges between 10% and 99% of a thickness T2 of the catcher 120.

In some embodiments, the heat dissipation structure 130 includes a plurality of the groove portions 131 arranged on the outer surface 122 of the catcher 120. In some embodiments, the heat dissipation structure 130 includes the plurality of groove portions 131 and a plurality of the bump portions 132 alternately arranged on the outer surface 122 of the catcher 120.

In some embodiments, the heat dissipation structure 130 includes a gas conduit 133 configured to provide a gas flow G1 toward the catcher 120. In some embodiments, the gas conduit 133 includes a gas outlet 133a facing the catcher 120. In some embodiments, the gas outlet 133a faces the second side 122b of the outer surface 122 of the catcher 120. In some embodiments, the gas conduit 133 is configured to provide the gas flow G1 to the groove portion 131. In some embodiments, the gas flow G1 may include inert gas or hydrogen. In some embodiments, the inert gas is argon.

In some embodiments, referring to FIG. 4, the catcher 120 includes an accommodating space 123 surrounded by the outer surface 122 of the catcher 120. In some embodiments, the heat dissipation structure 130 includes a first coolant conduit 135 coupled to the catcher 120 and in communication with the accommodating space 123. In some embodiments, the heat dissipation structure 130 includes a second coolant conduit 136 coupled to the catcher 120, in communication with the accommodating space 123 and separated from the first coolant conduit 135. In some embodiments, the first coolant conduit 135 is coupled to the second side 122b of the catcher 120. In some embodiments, the second coolant conduit 136 is coupled to the second side 122b of the catcher 120.

In some embodiments, the first coolant conduit 135 is in communication with the second coolant conduit 136 through the accommodating space 123. In some embodiments, the accommodating space 123 is configured to accommodate a coolant C2. The coolant C2 may increase an efficiency of the heat dissipation. In some embodiments, the first coolant conduit 135 is configured to introduce the coolant C2 into the accommodating space 123, and the second coolant conduit 136 is configured to remove the coolant C2 from the accommodating space 123. In some embodiments, the catcher 120 includes the accommodating space 123, and the heat dissipation structure 130 includes the groove portion 131, the bump portion 132, the gas conduit 133, the first coolant conduit 135 and the second coolant conduit 136.

Figure 5:
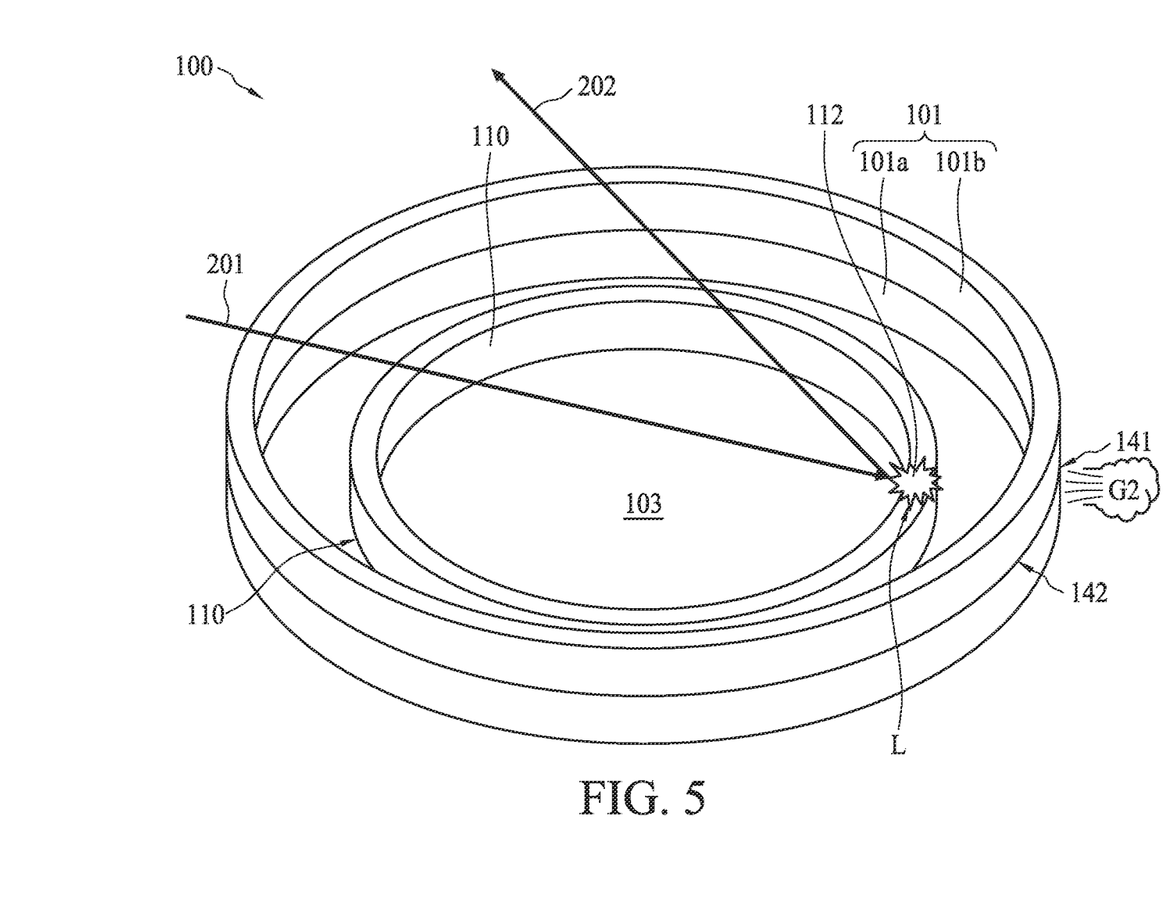
FIG. 5 is a schematic view of a portion of an EUV radiation source apparatus according to aspects of the present disclosure in some embodiments.

FIG. 5 is a schematic view of a portion of an EUV radiation source apparatus 100 in accordance with some embodiments of the present disclosure. In some embodiments, referring to FIG. 1 and FIG. 5, the venting system 140 is configured to vent a gas G2 out of the chamber 103 and decrease a temperature of the chamber 103. In some embodiments, the venting system 140 includes an opening 141 disposed on the EUV source vessel 101 and configured to vent the gas G2 out of the chamber 103. In some embodiments, a diameter of the opening 141 is less than 5 nm. In some embodiments, the diameter of the opening 141 is less than 2 nm.

In some embodiments, the EUV source vessel 101 includes a first portion 101a and a second portion 101b disposed adjacent to the first portion 101a. In some embodiments, the first portion 101a and the second portion 101b define the chamber 103. In some embodiments, the second portion 101b is disposed over the first portion 101a. In some embodiments, the venting system 140 is disposed between the first portion 101a and the second portion 101b.

Figure 6A:
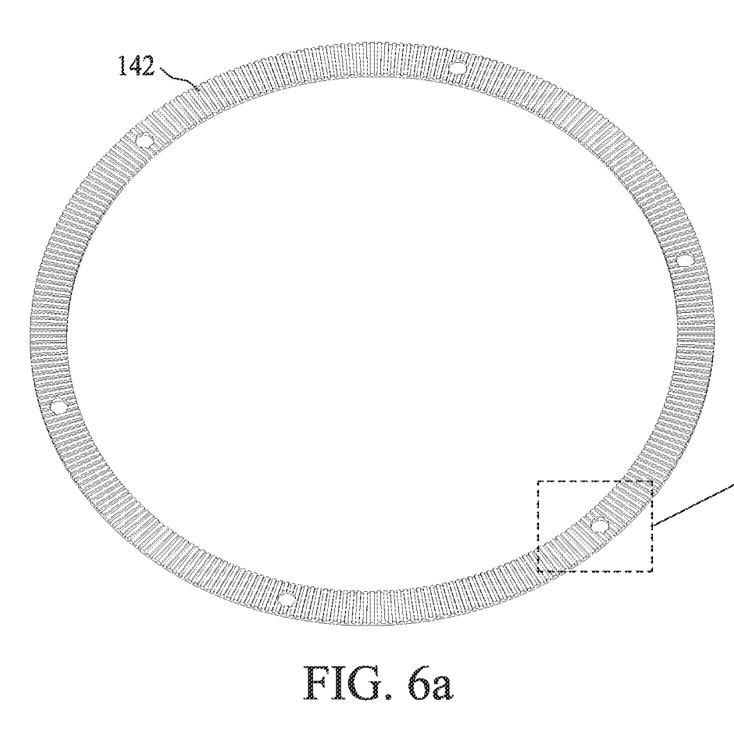
FIG. 6a is a schematic view of a venting component of an EUV radiation source apparatus according to aspects of the present disclosure in some embodiments.
Figure 6B:
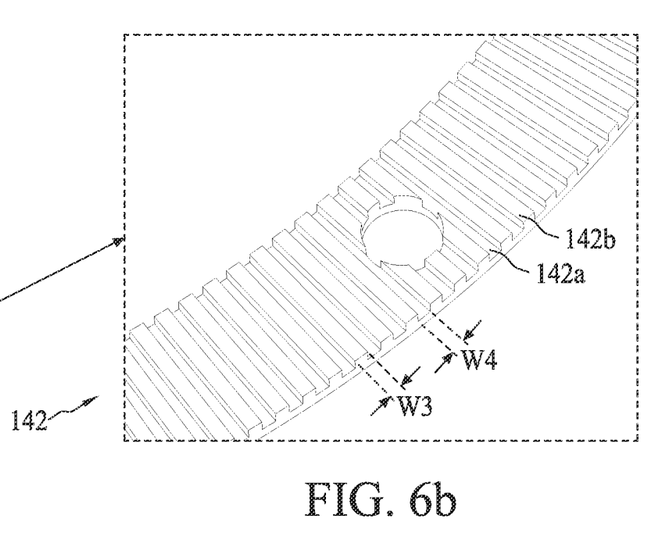

FIG. 6a is a schematic view of a venting component 142 of an EUV radiation source apparatus 100 in accordance with some embodiments of the present disclosure. FIG. 6b is an enlarged schematic view of the venting component 142 shown in FIG. 6a.

In some embodiments, referring to FIGS. 1, 2, 6a and 6b, the venting system 140 includes the venting component 142 disposed between the first portion 101a and the second portion 101b. In some embodiments, the venting component 142 is engageable with and disposed between the first portion 101a and the second portion 101b. In some embodiments, the venting component 142 is disposed at one side of the chamber 103 and between a portion of the first portion 101a and a corresponding portion of the second portion 101b. In some embodiments, the venting component 142 surrounds the chamber 103. In some embodiments, the venting component 142 is ring-shaped and matches a shape of the EUV source vessel 101. In some embodiments, a plurality of the venting components 142 are disposed between the first portion 101a and the second portion 101b.

In some embodiments, the venting component 142 has a plurality of grooves 142a. In some embodiments, when the venting component 142 is engaged with the first portion 101a or the second portion 101b, the grooves 142a become openings 141 disposed on the EUV source vessel 101 and in communication with the chamber 103. In some embodiments, the venting component 142 further includes a plurality of bumps 142b, and the plurality of grooves 142a and the plurality of bumps 142b are alternately arranged. In some embodiments, each of the grooves 142a has a third width W3, and each of the bumps 142b has a fourth width W4. A width ratio (W3/W4) of the groove 142a and the bump 142b is between 1:1 and 10:1.

Figure 7:
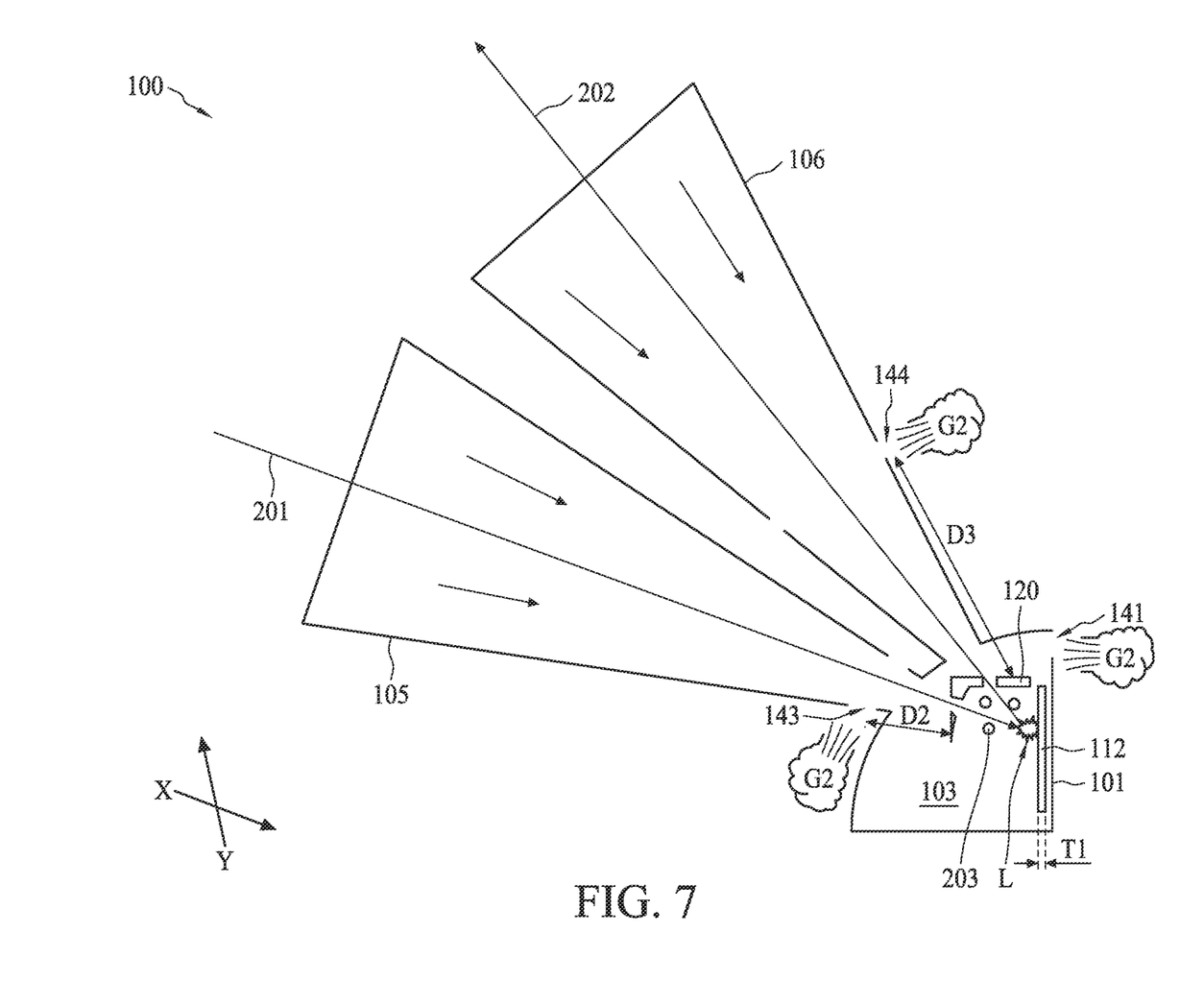
FIG. 7 is a schematic view of an EUV radiation source apparatus in accordance with some embodiments of the present disclosure.

FIG. 7 is a schematic view of an EUV radiation source apparatus 100 including an EUV source vessel 101 in accordance with some embodiments of the present disclosure. In some embodiments, referring to FIGS. 1 and 7, the EUV source vessel 101 further includes a first channel 105 configured to introduce a laser beam 201 into a chamber 103 and a second channel 106 configured to allow EUV radiation 202 to exit the chamber 103. In some embodiments, the first channel 105 and the second channel 106 are respectively coupled to the EUV source vessel 101 and in communication with the chamber 103. In some embodiments, the first channel 105 is disposed adjacent to a first aperture 121 of a catcher 120 and configured to be an entrance of the laser beam 201 into the chamber 103. In some embodiments, the first channel 105 includes a first segment 105a disposed outside the chamber 103 and a second segment 105b disposed within the chamber 103. In some embodiments, the second channel 106 is disposed adjacent to a second aperture 124 of the catcher 120 and configured to be an exit of the EUV radiation 202 out of the chamber 103. In some embodiments, the second channel 106 includes a first segment 106a disposed outside the chamber 103 and a second segment 106b disposed within the chamber 103.

In some embodiments, the second channel 106 is aimed toward the first aperture 121. In some embodiments, the first channel 105 is aimed toward the second aperture 124. In some embodiments, each of the first channel 105 and the second channel 106 is a cylinder. In some embodiments, each of the first channel 105 and the second channel 106 includes a conical shape, and a tip of the conical shape is coupled to the chamber 103.

In some embodiments, an opening 143 is disposed on the first channel 105. In some embodiments, the opening 143 is disposed on the first segment 105a of the first channel 105. In other embodiments, the opening 143 is disposed on the second segment 105b of the first channel 105. In some embodiments, the opening 143 is a slit surrounding the first channel 105. In some embodiments, the opening 143 is a 1 mm gap. In some embodiments, an opening 144 is disposed on the second channel 106. In some embodiments, the opening 144 is disposed on the first segment 106a of the second channel 106, but the disclosure is not limited thereto. In some embodiments, the opening 144 is a slit surrounding the second channel 106. In some embodiments, the opening 144 is a 1 mm gap. In some embodiments, a distance D2 between the opening 143 and the catcher 120 is less than a distance D3 between the opening 144 and the catcher 120. In some embodiments, a distance between the opening 143 and the chamber 103 is less than a distance between the opening 144 and the chamber 103.

Figure 8:
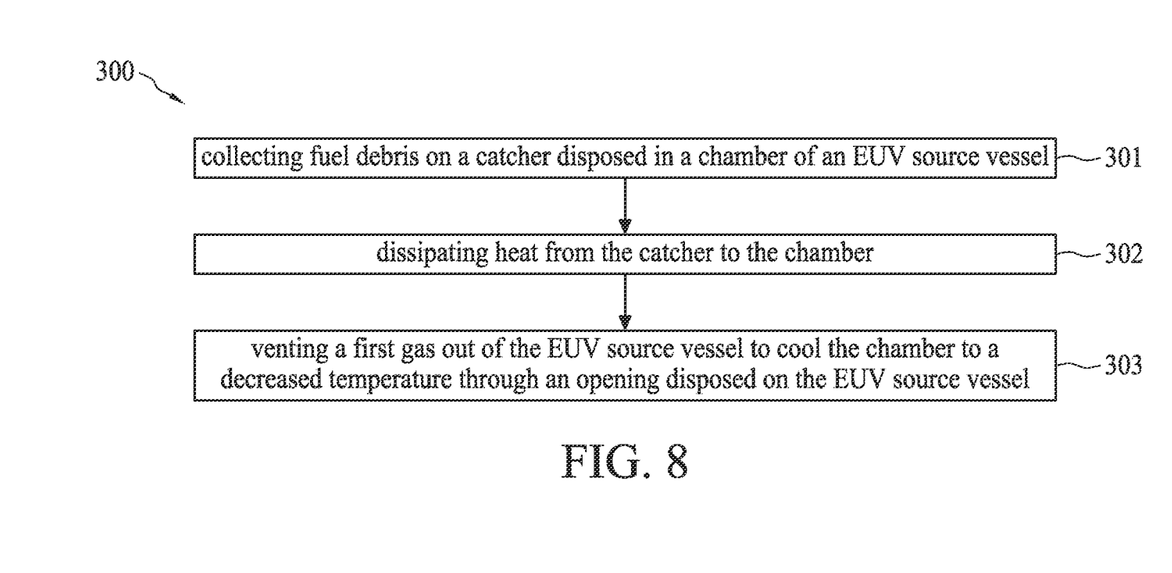
FIG. 8 is a flowchart of a method for generating extreme ultraviolet (EUV) radiation in accordance with some embodiments of the present disclosure.

According to some embodiments of the present disclosure, a method for generating EUV radiation is disclosed. In some embodiments, the method 300 utilizes an EUV radiation source apparatus 100. The method 300 includes a number of operations, and the description and illustration are not deemed as a limitation to the sequence of operations. FIG. 8 is a flowchart of the method 300 in accordance with some embodiments. The method 300 includes a number of operations (301 to 303). Additional steps can be provided before, during, and after the steps shown in FIG. 8, and some of the steps described below can be replaced or eliminated in other embodiments of the method 300. The order of the steps may be interchangeable.

In operation 301, referring to FIG. 8, fuel debris is collected on a catcher disposed in a chamber of an EUV source vessel. In operation 302, heat is dissipated from the catcher to the chamber. In operation 303, a first gas is vented out of the EUV source vessel to cool the chamber to a decreased temperature through an opening disposed on the EUV source vessel.

Figure 9:
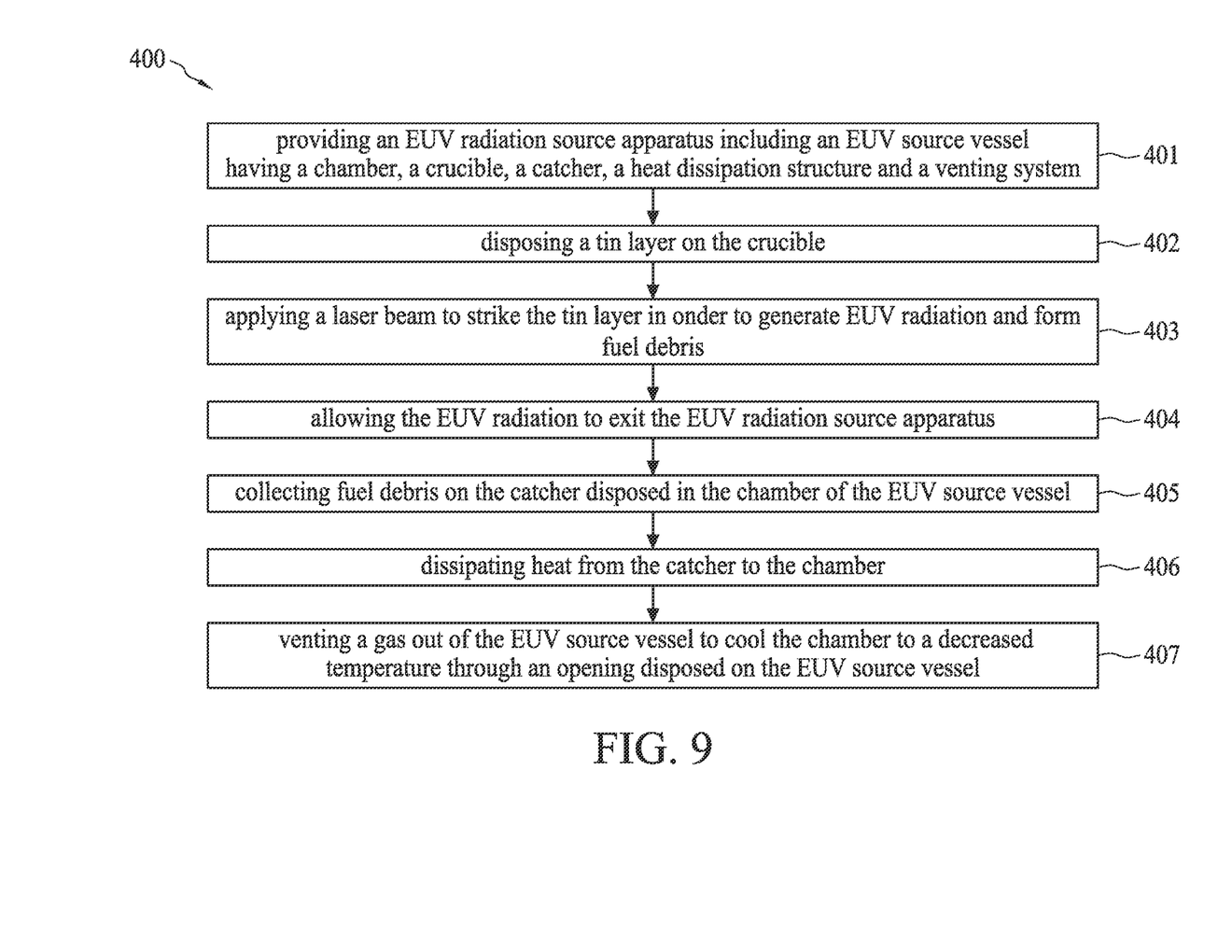
FIG. 9 is a flowchart of a method for generating extreme ultraviolet (EUV) radiation in accordance with some embodiments of the present disclosure.

According to some embodiments of the present disclosure, another method for generating EUV radiation is disclosed. In some embodiments, the method 400 utilizes an EUV radiation source apparatus 100. The method 400 includes a number of operations, and the description and illustration are not deemed as a limitation to the sequence of operations. FIG. 9 is a flowchart of the method 400 in accordance with some embodiments. The method 400 includes a number of operations (401 to 407). Additional steps can be provided before, during, and after the steps shown in FIG. 9, and some of the steps described below can be replaced or eliminated in other embodiments of the method 400. The order of the steps may be interchangeable.

The method 400 begins with operation 401, in which an EUV radiation source apparatus 100 including an EUV source vessel 101 having a chamber 103, a crucible 110, a catcher 120, a heat dissipation structure 130 and a venting system 140 is provided. The method 400 continues with operation 402, in which a tin layer 112 is disposed on the crucible 110.

In some embodiments, the EUV radiation source apparatus 100 shown in FIG. 1 is provided. In some embodiments, a first channel 105 and a second channel 106 are provided and respectively coupled to the EUV source vessel 101. The first channel 105 and the second channel 106 are in communication with the chamber 103. In some embodiments, an opening 143 is disposed on the first channel 105, and an opening 144 is disposed on the second channel 106. In some embodiments, the catcher 120 is disposed over the tin layer 112. In some embodiments, the method 400 further includes rotating the crucible 110, wherein the tin layer 112 disposed on the crucible 110 is rotated with the crucible 110. In some embodiments, additional components may also be enclosed in the chamber 103, but the disclosure is not limited thereto.

The method 400 continues with operation 403. Operation 403 includes applying a laser beam 201 to strike the tin layer 112 in order to generate EUV radiation 202 and form fuel debris 203. The method 400 continues with operation 404, in which the EUV radiation 202 exits the EUV radiation source apparatus 100. In some embodiments, the operations 403 and 404 are performed simultaneously.

In some embodiments, the laser beam 201 is provided into the EUV radiation source apparatus 100 in a second direction X. In some embodiments, the laser beam 201 is provided into the chamber 103 of the EUV source vessel 101 through the first channel 105. In some embodiments, the laser beam 201 passes through a second aperture 124 of the catcher 120 before striking the tin layer 112.

In some embodiments, the EUV radiation 202 exits the EUV radiation source apparatus 100 in a third direction Y different from the second direction X. In some embodiments, the second direction X forms an acute angle with the third direction Y. In some embodiments, the second direction X is orthogonal to the third direction Y. In some embodiments, the EUV radiation 202 exits the chamber 103 of the EUV source vessel 101 through the second channel 106. In some embodiments, the EUV radiation 202 passes through a first aperture 121 of the catcher 120 and enters the second channel 106.

The method 400 continues with operation 405. Operation 405 includes collecting fuel debris 203 on the catcher 120 disposed in the chamber 103 of the EUV source vessel 101. In some embodiments, the operations 403, 404 and 405 can be performed simultaneously. In some embodiments, operation 405 of the method 400 is similar to operation 301 of the method 300.

In some embodiments, when the tin layer 112 is struck by the laser beam 201, the fuel debris 203 generated from the collision may be collected by the catcher 120 and prevented from splashing around the chamber 103. In some embodiments, the fuel debris 203 generated at a location L is trapped by the catcher 120 and the crucible 110. In some embodiments, a temperature of the catcher 120 is increased to a first temperature when the fuel debris 203 is disposed on the catcher 120. In some embodiments, the first temperature is between 450° C. and 550° C.

The method 400 continues with operation 406. Operation 406 includes dissipating heat from the catcher 120 to the chamber 130. In some embodiments, operation 406 of the method 400 is similar to operation 302 of the method 300.

In some embodiments, referring to FIGS. 1 and 3, a gas G1 is provided to the catcher 120 through a gas conduit 133. In some embodiments, the gas G1 exits the gas conduit 133 through a gas outlet 133a and is blown against an outer surface 122 of the catcher 120. In some embodiments, the gas G1 is blown against the catcher 120, and the temperature of the catcher 120 is decreased from the first temperature to a second temperature less than the first temperature. In some embodiments, the second temperature is less than 450° C. In some embodiments, the second temperature is between 350° C. and 400° C.

In some embodiments, the gas G1 is blown against a groove portion 133 and a bump portion 132 of the catcher 120. The groove portion 133 and the bump portion 132 of the catcher 120 increase a surface area of the outer surface 122 of the catcher 120, and the temperature of the catcher 120 may decrease from the first temperature to the second temperature more efficiently.

In some embodiments, referring to FIGS. 1, 4 and 7, a coolant C2 is provided to an accommodating space 123 of the catcher 120. In some embodiments, the coolant C2 flows into and then out of the catcher 120. In some embodiments, the coolant C2 flows into the accommodating space 123 through a first coolant conduit 135 coupled to the catcher 120 and in communication with the accommodating space 123. In some embodiments, the coolant C2 flows out of the accommodating space 123 through a second coolant conduit 136 coupled to the catcher 120, in communication with the accommodating space 123 and separated from the first coolant conduit 135. In some embodiments, a temperature of the coolant C2 is increased after the coolant C2 passes through the catcher 120.

The method 400 continues with operation 407. Operation 407 includes venting a gas G2 out of the EUV source vessel 101 to cool the chamber 103 to a decreased temperature through an opening 141 disposed on the EUV source vessel 101. In some embodiments, operation 407 of the method 400 is similar to operation 303 of the method 300.

In some embodiments, the decreased temperature is between 300° C. and 400° C. In some alternative embodiments, the EUV source vessel 101 is sealed and no gas is vented from the chamber 103, and the temperature of the chamber 103 ranges between 400° C. and 450° C. In some embodiments, for the chamber 103 having the decreased temperature, an EUV brightness variation of the EUV radiation 202 is less than 10%. In some alternative embodiments, the EUV source vessel 101 is sealed and no gas is vented from the chamber 103, and an EUV brightness variation of the EUV radiation 202 is greater than 25%.

In some embodiments, referring to FIGS. 1 and 5, the gas G2 is vented out of the chamber 103 through the opening 141 between a first portion 101a and a second portion 101b of the EUV source vessel 101. In some embodiments, the gas G2 is vented out of the chamber 103 through a plurality of the openings 141 between the first portion 101a and the second portion 101b of the EUV source vessel 101. In such embodiments, the vacuum state of the chamber 103 may be impervious to the vented-out gas G2.

In some embodiments, referring to FIGS. 1, 5, 6a and 6b, the method 400 further includes disposing a venting component 142 between the first portion 101a and the second portion 101b of the EUV source vessel 101, wherein the venting component 142 includes a plurality of bumps 142b and a plurality of grooves 142a alternately arranged. In some embodiments, the gas G2 is vented out of the chamber 103 through the plurality of grooves 142a of the venting component 142 between the first portion 101a and the second portion 101b.

In some embodiments, referring to FIGS. 1 and 7, the gas G2 is vented out of the EUV source vessel 101 through an opening 143 disposed on the first channel 105. In some embodiments, the gas G2 is vented out of the EUV source vessel 101 through a slit disposed on the first channel 105. In some embodiments, the method 400 further includes providing a gas flow into the first channel 105, wherein the gas flow flows from the first channel 105 toward the tin layer 112. In some embodiments, the gas G2 is vented out of the EUV source vessel 101 through an opening 144 disposed on the second channel 106. In some embodiments, the gas G2 is vented out of the EUV source vessel 101 through a slit disposed on the second channel 106. In some embodiments, the method 400 further includes providing a gas flow into the second channel 106, wherein the gas flow flows from the second channel 106 toward the tin layer 112. In some embodiments, the gas G2 is vented out of the EUV source vessel 101 through the opening 141, the opening 143, and the opening 144. In some embodiments, the gas flow includes an inert gas, such as argon. In some embodiments, the operations 403 to 407 are performed simultaneously. In such embodiments, the vacuum state of the chamber 103 may be impervious to the flow-into gas and the vented-out gas.

In some embodiments, the operation 406 and the operation 407 are individually or independently performed.

In some embodiments, after the operations 403 to 407 are performed, a thickness T1 of the tin layer 112 is uniform. In some embodiments, a variation of the thickness of the tin layer 112 is less than 15 nm. In some alternative embodiments, the operation 406 and/or the operation 407 is omitted, and the variation of the thickness of the tin layer 112 is greater than 30 um. In some alternative embodiments, the operation 406 and/or the operation 407 is omitted, and the variation of the thickness of the tin layer 112 is greater than 80 um.

One aspect of the present disclosure relates to an EUV radiation source apparatus. The EUV radiation source apparatus includes an EUV source vessel including a chamber; a crucible disposed in the chamber; a tin layer disposed on the crucible; a catcher disposed in the chamber and configured to collect fuel debris generated from a collision of the tin layer and a laser beam; a heat dissipation structure disposed over the catcher; and a venting system coupled to the EUV source vessel and communicable with the chamber.

In some embodiments, the heat dissipation structure includes a groove portion and a bump portion arranged on an outer surface of the catcher. In some embodiments, a width ratio of the groove portion and the bump portion ranges between 1:1 and 10:1. In some embodiments, a depth of the groove portion ranges between 10% and 99% of a thickness of the catcher. In some embodiments, the heat dissipation structure includes a gas conduit including a gas outlet, wherein the gas outlet faces an outer surface of the catcher. In some embodiments, the catcher includes an accommodating space, the heat dissipation structure includes a first coolant conduit and a second coolant conduit, the first coolant conduit is coupled to the catcher and in communication with the accommodating space, and the second coolant conduit is coupled to the catcher, in communication with the accommodating space and separated from the first coolant conduit.

In some embodiments, the venting system includes an opening disposed on the EUV source vessel and configured to vent a gas out of the chamber. In some embodiments, the EUV source vessel includes a first portion and a second portion disposed adjacent to the first portion, the venting system includes a venting component disposed between the first portion and the second portion, and the venting component has a plurality of grooves and an opening in communication with the chamber. In some embodiments, the EUV source vessel further includes a first channel configured to introduce the laser beam into the chamber and a second channel configured to remove the EUV radiation from the chamber, the first channel and the second channel are respectively coupled to the EUV source vessel and in communication with the chamber, and an opening is disposed on the first channel or the second channel.

An aspect of this disclosure relates to an EUV radiation source apparatus. The EUV radiation source apparatus includes an EUV source vessel including a chamber; a crucible disposed in the chamber; a catcher configured to collect fuel debris generated from a collision of a tin layer and a laser beam, wherein the catcher is disposed in the chamber and over the crucible, and the catcher includes a first aperture, configured to be an exit of the EUV radiation, and a heat dissipation structure; and a first opening formed on the EUV source vessel and configured to dissipate heat or gas from the chamber.

In some embodiments, the catcher further includes a second aperture configured to allow the laser beam to be directed toward the tin layer. In some embodiments, the EUV source vessel further includes a first channel and a second channel, wherein the first channel is disposed adjacent to the first aperture and configured to be an exit of the EUV radiation out of the chamber, and the second channel is disposed adjacent to the second aperture and configured to be an entrance of the laser beam into the chamber. In some embodiments, the EUV radiation source apparatus further includes a second opening formed on the first channel, and a third opening formed on the second channel. In some embodiments, a first distance between the second opening and the catcher is less than a second distance between the third opening and the catcher. In some embodiments, the heat dissipation structure includes a plurality of grooves arranged on an outer surface of the catcher. In some embodiments, the heat dissipation structure includes a gas conduit having a gas outlet, wherein the gas outlet faces an outer surface of the catcher.

An aspect of the present disclosure relates to a method for generating EUV radiation. The method includes collecting fuel debris on a catcher disposed in a chamber of an EUV source vessel; dissipating heat from the catcher to the chamber; and venting a first gas out of the EUV source vessel to cool the chamber to a decreased temperature through an opening disposed on the EUV source vessel.

In some embodiments, the method further includes providing a second gas toward the catcher through a gas conduit. In some embodiments, the method further includes conducting a coolant into an accommodating space of the catcher. In some embodiments, the decreased temperature is between 300° C. and 400° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) radiation source apparatus, comprising:
   an EUV source vessel including a chamber;
   a crucible disposed in the chamber;
   a tin layer disposed on the crucible;
   a catcher disposed in the chamber and configured to collect fuel debris generated from a collision of the tin layer and a laser beam;
   a heat dissipation structure disposed over the catcher; and
   a venting system coupled to the EUV source vessel and communicable with the chamber.

2. The EUV radiation source apparatus of claim 1, wherein the heat dissipation structure includes a groove portion and a bump portion arranged on an outer surface of the catcher.

3. The EUV radiation source apparatus of claim 2, wherein a width ratio of the groove portion and the bump portion is between 1:1 and 10:1.

4. The EUV radiation source apparatus of claim 2, wherein a depth of the groove portion is between 10% and 99% of a thickness of the catcher.

5. The EUV radiation source apparatus of claim 2, wherein the heat dissipation structure includes a gas conduit having a gas outlet, and the gas outlet faces an outer surface of the catcher.

6. The EUV radiation source apparatus of claim 1, wherein the catcher includes an accommodating space, the heat dissipation structure includes a first coolant conduit and a second coolant conduit, the first coolant conduit is coupled to the catcher and is in communication with the accommodating space, and the second coolant conduit is coupled to the catcher, in communication with the accommodating space and separated from the first coolant conduit.

7. The EUV radiation source apparatus of claim 1, wherein the venting system includes an opening disposed on the EUV source vessel and configured to vent a gas out of the chamber.

8. The EUV radiation source apparatus of claim 1, wherein the EUV source vessel includes a first portion and a second portion disposed adjacent to the first portion, the venting system includes a venting component disposed between the first portion and the second portion, and the venting component has a plurality of grooves and an opening in communication with the chamber.

9. The EUV radiation source apparatus of claim 1, wherein the EUV source vessel further includes a first channel configured to introduce the laser beam into the chamber and a second channel configured to allow the EUV radiation to exit the chamber, wherein the first channel and the second channel are respectively coupled to the EUV source vessel and in communication with the chamber, and an opening is disposed on the first channel or the second channel.

10. An extreme ultraviolet (EUV) radiation source apparatus, comprising:
    an EUV source vessel including a chamber;
    a crucible disposed in the chamber;

a catcher configured to collect fuel debris generated from a collision of a tin layer and a laser beam, wherein the catcher is disposed in the chamber and over the crucible, and the catcher includes a heat dissipation structure and a first aperture configured to be an exit of EUV radiation; and a first opening formed on the EUV source vessel and configured to dissipate heat or gas from the chamber.

11. The EUV radiation source apparatus of claim 10, wherein the catcher further includes a second aperture configured to be an entrance of the laser beam to allow the laser beam to be directed toward the tin layer.

12. The EUV radiation source apparatus of claim 11, wherein the EUV source vessel further includes a first channel and a second channel, the first channel is disposed adjacent to the first aperture and configured to be an exit of the EUV radiation out of the chamber, and the second channel is disposed adjacent to the second aperture and configured to be an entrance of the laser beam into the chamber.

13. The EUV radiation source apparatus of claim 12, further comprising a second opening formed on the first channel, and a third opening formed on the second channel.

14. The EUV radiation source apparatus of claim 13, wherein a first distance between the second opening and the catcher is less than a second distance between the third opening and the catcher.

15. The EUV radiation source apparatus of claim 10, wherein the heat dissipation structure includes a plurality of grooves arranged on an outer surface of the catcher.

16. The EUV radiation source apparatus of claim 10, wherein the heat dissipation structure includes a gas conduit having a gas outlet, and the gas outlet faces an outer surface of the catcher.

17. A method for generating extreme ultraviolet (EUV) radiation, comprising:

collecting fuel debris on a catcher disposed in a chamber of an EUV source vessel;

dissipating heat from the catcher to the chamber; and venting a first gas out of the EUV source vessel to cool the chamber to a decreased temperature through an opening disposed on the EUV source vessel.

18. The method of claim 17, further comprising:

providing a second gas toward the catcher through a gas conduit.

19. The method of claim 17, further comprising:

conducting a coolant into an accommodating space of the catcher.

20. The method of claim 17, wherein the decreased temperature is between 300° C. and 400° C.

* * * * *